United States Patent
Unezaki et al.

(10) Patent No.: US 11,398,389 B2
(45) Date of Patent: Jul. 26, 2022

(54) METHOD OF PRODUCING ELECTRONIC DEVICE

(71) Applicant: MITSUI CHEMICALS TOHCELLO, INC., Tokyo (JP)

(72) Inventors: Takashi Unezaki, Ichihara (JP); Jun Kamada, Narashino (JP); Akimitsu Morimoto, Kawasaki (JP); Jin Kinoshita, Nagoya (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 0 days.

(21) Appl. No.: 16/631,344

(22) PCT Filed: Jul. 9, 2018

(86) PCT No.: PCT/JP2018/025877
§ 371 (c)(1),
(2) Date: Jan. 15, 2020

(87) PCT Pub. No.: WO2019/017226
PCT Pub. Date: Jan. 24, 2019

(65) Prior Publication Data
US 2020/0219734 A1   Jul. 9, 2020

(30) Foreign Application Priority Data
Jul. 20, 2017   (JP) .............................. JP2017-141005

(51) Int. Cl.
*H01L 21/56*   (2006.01)
*H01L 21/304*   (2006.01)
(Continued)

(52) U.S. Cl.
CPC .......... *H01L 21/561* (2013.01); *H01L 21/304* (2013.01); *H01L 21/568* (2013.01);
(Continued)

(58) Field of Classification Search
None
See application file for complete search history.

(56) References Cited

U.S. PATENT DOCUMENTS

| 10,340,172 B2 | 7/2019 | Kamada et al. |
| 2003/0218257 A1* | 11/2003 | Ishio ...................... H01L 24/97 257/781 |

(Continued)

FOREIGN PATENT DOCUMENTS

| JP | 2002134441 A | 5/2002 |
| JP | 2004363139 A | 12/2004 |

(Continued)

OTHER PUBLICATIONS

International Search Report (PCT/ISA/210) dated Sep. 25, 2018, by the Japanese Patent Office as the International Searching Authority for in corresponding International Patent Application No. PCT/JP2018/025877.

(Continued)

*Primary Examiner* — Jay C Chang
(74) *Attorney, Agent, or Firm* — Buchanan Ingersoll & Rooney PC

(57) ABSTRACT

Provided is a method of producing an electronic device, including a step of preparing a structure which includes an electronic component having a circuit forming surface, and an adhesive laminated film which includes a base material layer and an adhesive resin layer and in which the adhesive resin layer is attached to the circuit forming surface of the electronic component; a step of back-grinding a surface of the electronic component opposite to the circuit forming surface in a state of being attached to the adhesive laminated film; a step of dicing the electronic component in a state of being attached to the adhesive laminated film; and a step of forming an electromagnetic wave-shielding layer on the (Continued)

separated electronic components in a state of being attached to the adhesive laminated film, in this order.

11 Claims, 3 Drawing Sheets

(51) Int. Cl.
    *H01L 21/683*     (2006.01)
    *H01L 21/78*     (2006.01)
    *H01L 23/552*     (2006.01)

(52) U.S. Cl.
    CPC .......... *H01L 21/6835* (2013.01); *H01L 21/78* (2013.01); *H01L 23/552* (2013.01)

(56) References Cited

U.S. PATENT DOCUMENTS

| | | | | |
|---|---|---|---|---|
| 2004/0178500 | A1* | 9/2004 | Usui | H01L 24/97 257/734 |
| 2005/0057789 | A1* | 3/2005 | Funada | G03H 1/0276 359/31 |
| 2011/0156225 | A1* | 6/2011 | Hozoji | H01L 23/66 257/659 |
| 2012/0070960 | A1* | 3/2012 | Murata | C09J 7/385 438/464 |
| 2012/0168214 | A1 | 7/2012 | Kashiwagi et al. | |
| 2013/0120699 | A1 | 5/2013 | Ichihara et al. | |
| 2014/0044957 | A1* | 2/2014 | Hirayama | H01L 21/68 428/327 |
| 2014/0332910 | A1* | 11/2014 | Kuisma | B81B 7/0048 257/416 |
| 2016/0141208 | A1* | 5/2016 | Joachim | H01L 21/78 438/114 |
| 2017/0103919 | A1* | 4/2017 | Kim | H01L 21/76898 |
| 2018/0197764 | A1 | 7/2018 | Kamada et al. | |

FOREIGN PATENT DOCUMENTS

| | | |
|---|---|---|
| JP | 2011119369 A | 6/2011 |
| JP | 2011-159786 A | 8/2011 |
| JP | 2011151372 A | 8/2011 |
| JP | 2012-099622 A | 5/2012 |
| JP | 2015176950 A | 10/2015 |
| WO | 2010029819 A1 | 3/2010 |
| WO | 2017006549 A1 | 1/2017 |

OTHER PUBLICATIONS

Extended European Search Report dated Apr. 8, 2021, by the European Patent Office in corresponding European Patent Application No. 18835850.01. (8 pages).

\* cited by examiner

METHOD OF PRODUCING ELECTRONIC DEVICE

TECHNICAL FIELD

The present invention relates to a method of producing an electronic device.

BACKGROUND ART

In steps of producing an electronic device, a step of forming an electromagnetic wave-shielding layer on a surface of an electronic component in a state in which a circuit forming surface of the electronic component is protected with a protective film or the like in order to impart an electromagnetic wave-shielding property to the electronic component is performed in some cases. In this manner, the electromagnetic wave-shielding property can be imparted to the electronic component, and electromagnetic wave noise generated from the electronic component can be blocked. Accordingly, it is possible to prevent the electronic component from adversely affecting other peripheral electronic components.

The techniques related to such an electromagnetic wave-shielding property of the electronic component are described in, for example, Patent Document 1 (PCT International Publication No. WO 2010/029819 pamphlet)

RELATED DOCUMENT

Patent Document

[Patent Document 1] PCT International Publication No. WO 2010/029819 pamphlet

SUMMARY OF THE INVENTION

Technical Problem

According to the examination conducted by the present inventors, it was found that a method of producing an electronic device having an electromagnetic wave-shielding property has the following problems.

First, the present inventors found that in a case where an electromagnetic wave-shielding layer 140 is formed on a surface of an electronic component 100 in a state in which a circuit forming surface 100A of the electronic component 100 is protected by a tape 130 for protecting a circuit forming surface as illustrated in FIG. 3 according to a method of producing an electronic device in the related art, the electromagnetic wave-shielding layer 140 is not formed on a lower end 150 of a side surface of the electronic component 100 in some cases. In this case, the electromagnetic wave-shielding property of the electronic component 100 deteriorates.

As the result of further examination conducted by the present inventors based on the findings described above, it was found that in a case where electronic components 100 attached to a dicing tape 120 are rearranged on the tape 130 for protecting a circuit forming surface as illustrated in FIG. 3, a portion (adhesive layer) in contact with the lower end 150 of a side surface of the electronic component 100 in the tape 130 for protecting a circuit forming surface protrudes so that the lower end 150 of the side surface of the electronic component 100 is covered with the portion in some cases. That is, according to the examination of the present inventors, it was clarified that since the lower end 150 of the side surface of the electronic component 100 is covered with an adhesive 160 constituting the adhesive layer of the tape 130 for protecting a circuit forming surface, the electromagnetic wave-shielding layer 140 is not formed on the lower end 150 of the side surface of the electronic component 100.

Further, the method of producing an electronic device having an electromagnetic wave-shielding property includes a back grinding step of attaching the electronic component 100 to a back grinding tape 110 as illustrated in FIG. 3, a dicing step of peeling the electronic component 100 off from the back grinding tape 110 and attaching the electronic component 100 to the dicing tape 120, and an electromagnetic wave-shielding layer forming step of peeling the diced electronic components 100 from the dicing tape 120 and rearranging the electronic components 100 on the tape 130 for protecting a circuit forming surface. Therefore, since the method of producing an electronic device of the related art uses three kinds of tapes for temporarily fixing the electronic component 100 and includes a step of attaching the electronic component 100 to each tape, a step of peeling the electronic component 100 off from each tape, and the like, the number of steps is extremely large.

That is, the present inventors found that there is room for improvement in the method of producing an electronic component having an electromagnetic wave-shielding property in terms of reducing the number of steps of producing an electronic device while favorably forming the electromagnetic wave-shielding layer on the electronic component.

The present invention has been made in consideration of the above-described circumstances, and an object thereof is to provide a method of producing an electronic device, which enables favorable formation of an electromagnetic wave-shielding layer on an electronic component and reduction in number of steps of producing an electronic device.

Solution to Problem

The present inventors repeatedly conducted intensive examination in order to solve the above-described problem. As the result, it was found that some steps such as the step of attaching the electronic component to each tape and the step of peeling the electronic component off from each tape can be omitted by using the identical adhesive laminated film as the film for protecting the circuit forming surface of the electronic component in the back grinding step, the dicing step, and the electromagnetic wave-shielding layer forming step, and the formation failure of the electromagnetic wave-shielding layer on the lower end of the side surface of the electronic component can be suppressed, thereby completing the present invention.

According to the present invention, there is provided a method of producing an electronic device described below.

[1]

A method of producing an electronic device, including: a step (A) of preparing a structure which includes an electronic component having a circuit forming surface, and an adhesive laminated film which includes a base material layer and an adhesive resin layer and in which the adhesive resin layer is attached to the circuit forming surface of the electronic component such that the circuit forming surface is protected; a step (B) of back-grinding a surface of the electronic component opposite to the circuit forming surface in a state of being attached to the adhesive laminated film; a step (C) of dicing the electronic component in a state of being attached to the adhesive laminated film; and a step (D) of forming an electromagnetic wave-shielding layer on the separated electronic components in a state of being attached to the adhesive laminated film, in this order, in which the identical adhesive laminated film is used as the adhesive laminated film in the step (A), the step (B), the step (C), and the step (D).

[2]
The method of producing an electronic device according to [1], in which the adhesive laminated film further includes an unevenness-absorptive resin layer between the base material layer and the adhesive resin layer.

[3]
The method of producing an electronic device according to [2], further including: a step (E) of crosslinking the unevenness-absorptive resin layer to improve heat resistance of the unevenness-absorptive resin layer between the step (A) and the step (D).

[4]
The method of producing an electronic device according to [2] or [3], in which the unevenness-absorptive resin layer contains a crosslinkable resin.

[5]
The method of producing an electronic device according to any one of [2] to [4], in which a thickness of the unevenness-absorptive resin layer is in a range of 10 μm to 1000 μm.

[6]
The method of producing an electronic device according to any one of [1] to [5], further including: a step (F) of peeling the electronic component and the adhesive laminated film from each other after the step (D).

[7]
The method of producing an electronic device according to [6], in which the electronic component is peeled off from the adhesive laminated film in the step (F) in a state in which an interval between adjacent electronic components is enlarged by expanding a region of the adhesive laminated film where the electronic component is attached, in an in-plane direction of the film.

[8]
The method of producing an electronic device according to [6] or [7], in which the adhesive resin layer contains a radiation-crosslinking adhesive, and the method further comprises a step (G) of irradiating the adhesive resin layer with radiation to crosslink the adhesive resin layer before the step (F).

[9]
The method of producing an electronic device according to any one of [1] to [8], in which the circuit forming surface of the electronic component includes a bump electrode.

[10]
The method of producing an electronic device according to [9], in which in a case where a height of the bump electrode is set as H [μm] and a thickness of the unevenness-absorptive resin layer is set as d [μm], H/d is in a range of 0.01 to 1.

[11]
The method of producing an electronic device according to any one of [1] to [10], in which the electromagnetic wave-shielding layer is formed on the electronic component in the step (D) using at least one method selected from a sputtering method, a vapor deposition method, a spray coating method, an electrolytic plating method, and an electroless plating method.

[12]
The method of producing an electronic device according to any one of [1] to [11], in which the electromagnetic wave-shielding layer is formed on at least a surface opposite to the circuit forming surface and a side surface that connects the circuit forming surface with the opposite surface of the electronic component in the step (D).

[13]
The method of producing an electronic device according to any one of [1] to [12], in which a resin constituting the base material layer contains one or two or more selected from the group consisting of a polyester-based elastomer, a polyamide-based elastomer, a polyimide-based elastomer, polybutylene terephthalate, polyethylene terephthalate, polyethylene naphthalate, and polyimide.

[14]
The method of producing an electronic device according to any one of [1] to [13], in which an adhesive constituting the adhesive resin layer contains one or two or more selected from a (meth) acrylic-based adhesive, a silicone-based adhesive, a urethane-based adhesive, an olefin-based adhesive, and a styrene-based adhesive.

Advantageous Effects of Invention

According to the present invention, it is possible to provide a method of producing an electronic device, which enables favorable formation of an electromagnetic wave-shielding layer on an electronic component and reduction in number of steps of producing an electronic device.

BRIEF DESCRIPTION OF THE DRAWINGS

The above-described purposes and other purposes, the features, and the advantages will become more evident based on preferred embodiments described below and the accompanying drawings.

DESCRIPTION OF EMBODIMENTS

Figure 1:
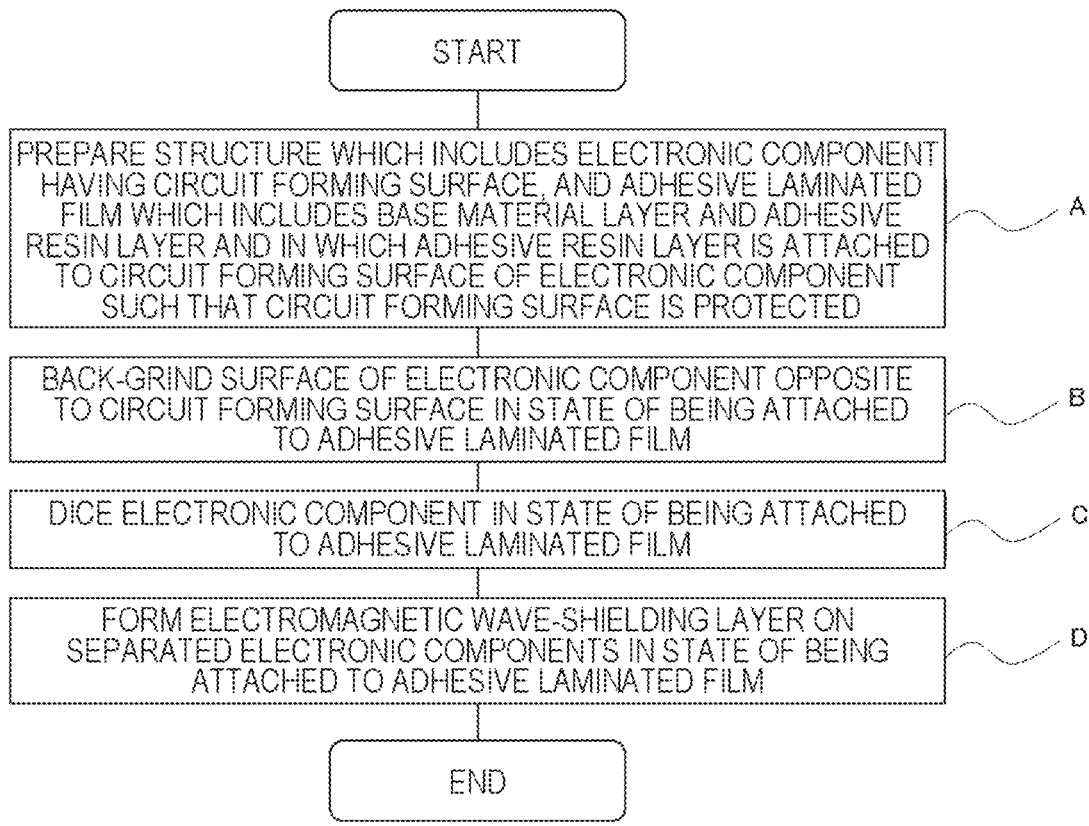
FIG. 1 is a flowchart showing an example of a method of producing an electronic device according to the present invention.
Figure 2A:
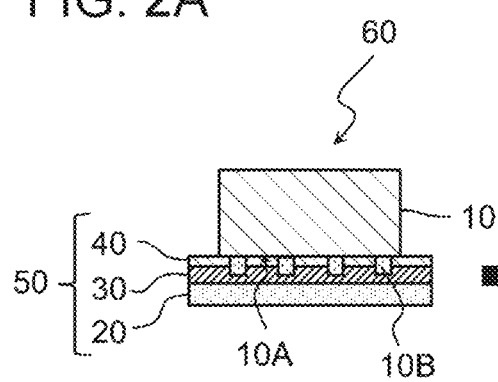
FIG. 2 is a cross sectional view schematically illustrating an example of the method of producing an electronic device according to an embodiment of the present invention.
Figure 2B:
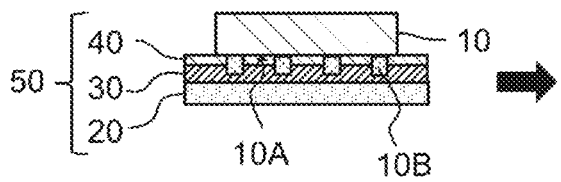
Figure 2C:
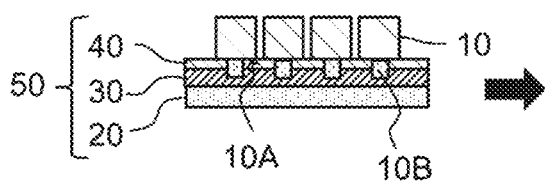
Figure 2D:
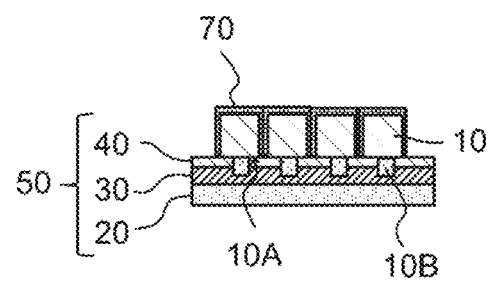

Hereinafter, embodiments of the present invention will be described based on the accompanying drawings. Further, the same constituent elements are denoted by the same reference numerals in all drawings, and the description thereof will not be repeated. Further, the drawings are schematically illustrated, and the sizes thereof do not the actual dimensional ratios. Further, "A to B" in a numerical range indicates greater than or equal to A and less than or equal to B unless otherwise specified. Further, in the present embodiment, "(meth)acryl" indicates acryl, methacryl, or both of acryl and methacryl.

FIG. 1 is a flowchart showing an example of a method of producing an electronic device according to the present invention. FIG. 2 is a cross sectional view schematically illustrating an example of the method of producing an electronic device according to an embodiment of the present invention.

The method of producing an electronic device according to the present invention includes at least a step (A), a step (B), a step (C), and a step (D) described below in this order, and the identical adhesive laminated film is used as an adhesive laminated film 50.

Step (A) of preparing a structure 60 which includes an electronic component 10 having a circuit forming surface 10A, and an adhesive laminated film 50 which includes a base material layer 20 and an adhesive resin layer 40 and in which the adhesive resin layer 40 is attached to the circuit forming surface 10A of the electronic component 10 such that the circuit forming surface 10A is protected;

Step (B) of back-grinding a surface of the electronic component 10 opposite to the circuit forming surface 10A in a state of being attached to the adhesive laminated film 50;

Step (C) of dicing the electronic component 10 in a state of being attached to the adhesive laminated film 50; and Step (D) of forming an electromagnetic wave-shielding layer 70 on the separated electronic components 10 in a state of being attached to the adhesive laminated film 50

Figure 3:
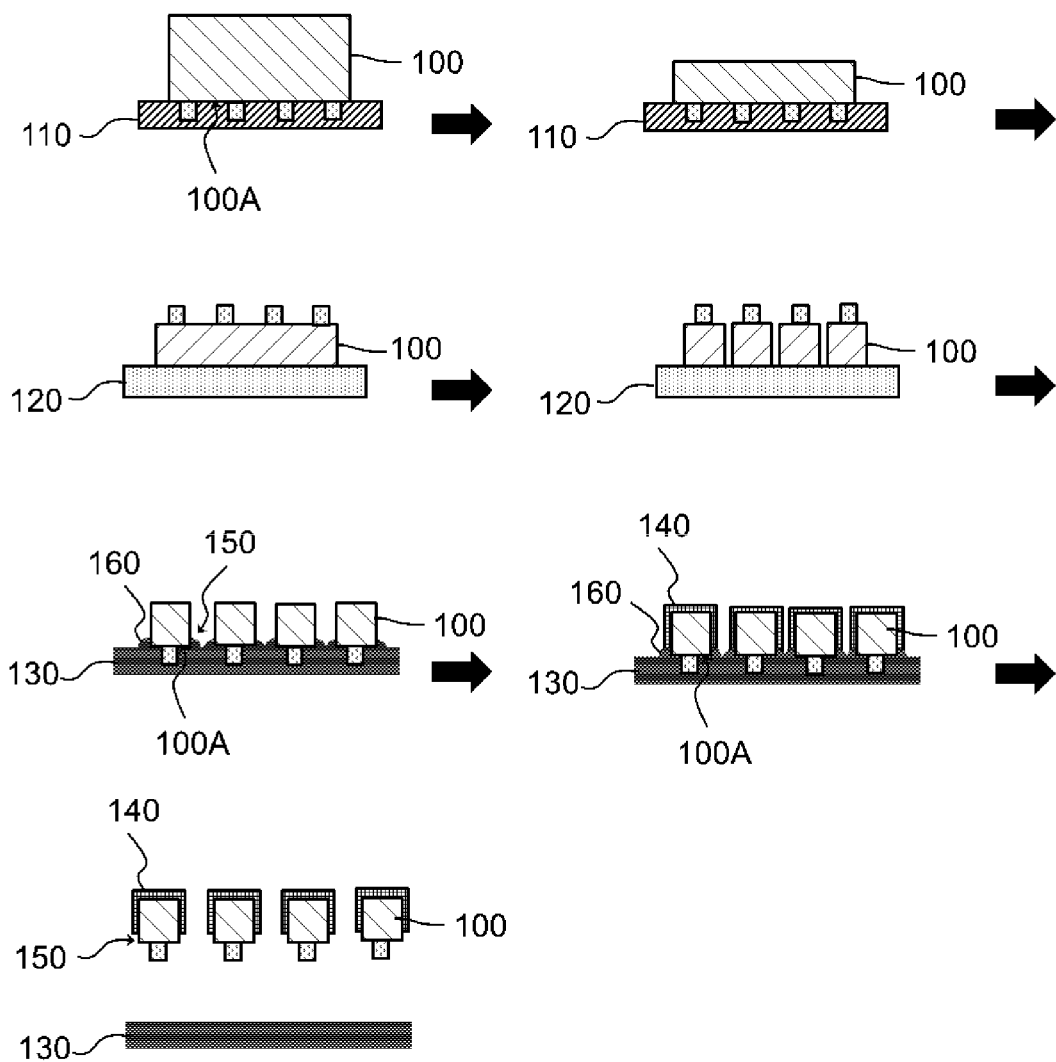
FIG. 3 is a cross sectional view schematically illustrating an example of a method of producing an electronic device in the related art.

As described above, according to the examination conducted by the present inventors, it was found that in a case where an electromagnetic wave-shielding layer 140 is formed on a surface of an electronic component 100 in a state in which a circuit forming surface 100A of the electronic component 100 is protected by a tape 130 for protecting a circuit forming surface as illustrated in FIG. 3 according to a method of producing an electronic device in the related art, the electromagnetic wave-shielding layer 140 is not formed on a lower end 150 of a side surface of the electronic component 100 in some cases. In this case, the electromagnetic wave-shielding property of the electronic component 100 deteriorates.

As the result of further examination conducted by the present inventors based on the findings described above, it was found that in a case where electronic components 100 attached to a dicing tape 120 are rearranged on the tape 130 for protecting a circuit forming surface as illustrated in FIG. 3, a portion (adhesive layer) in contact with the lower end 150 of a side surface of the electronic component 100 in the tape 130 for protecting a circuit forming surface protrudes so that the lower end 150 of the side surface of the electronic component 100 is covered with the portion in some cases. That is, according to the examination of the present inventors, it was clarified that since the lower end 150 of the side surface of the electronic component 100 is covered with an adhesive 160 constituting the adhesive layer of the tape 130 for protecting a circuit forming surface, the electromagnetic wave-shielding layer 140 is not formed on the lower end 150 of the side surface of the electronic component 100.

Further, the method of producing an electronic device having an electromagnetic wave-shielding property includes a back grinding step of attaching the electronic component 100 to a back grinding tape 110 as illustrated in FIG. 3, a dicing step of peeling the electronic component 100 off from the back grinding tape 110 and attaching the electronic component 100 to the dicing tape 120, and an electromagnetic wave-shielding layer forming step of peeling the diced electronic components 100 from the dicing tape 120 and rearranging the electronic components 100 on the tape 130 for protecting a circuit forming surface. Therefore, since the method of producing an electronic device of the related art uses three kinds of tapes for temporarily fixing the electronic component 100 and includes a step of attaching the electronic component 100 to each tape, a step of peeling the electronic component 100 off from each tape, and the like, the number of steps is extremely large.

That is, the present inventors found that there is room for improvement in the method of producing an electronic device having an electromagnetic wave-shielding property in terms of reducing the number of steps of producing an electronic device while favorably forming the electromagnetic wave-shielding layer on the electronic component.

The present inventors repeatedly conducted intensive examination in order to achieve the above-described object. As the result, it was found that some steps such as the step of attaching the electronic component 10 to each tape and the step of peeling the electronic component 10 off from each tape can be omitted by using the identical adhesive laminated film 50 as the film for protecting the circuit forming surface 10A of the electronic component 10 in the back grinding step, the dicing step, and the electromagnetic wave-shielding layer forming step, and the formation failure of the electromagnetic wave-shielding layer on the lower end of the side surface of the electronic component 10 can be suppressed.

The step of rearranging the electronic components 100 attached to the dicing tape 120 on the tape 130 for protecting a circuit forming surface as illustrated in FIG. 3 can be omitted by using the identical adhesive laminated film 50 as the film for protecting the circuit forming surface 10A of the electronic component 10 in the back grinding step, the dicing step, and the electromagnetic wave-shielding layer forming step. Therefore, a phenomenon in which the lower end of the side surface of the electronic component 10 is covered with an adhesive constituting the adhesive resin layer 40 does not occur. Accordingly, in the method of producing an electronic device according to the present embodiment, the electromagnetic wave-shielding layer 70 can be favorably formed on the lower end of the side surface of the electronic component 10.

Further, in the method of producing an electronic device according to the present embodiment, some steps such as the step of attaching the electronic component 10 to each tape and the step of peeling the electronic component 10 off from each tape can be omitted by using the identical adhesive laminated film 50 as the film for protecting the circuit forming surface 10A of the electronic component 10 in the back grinding step, the dicing step, and the electromagnetic wave-shielding layer forming step.

According to the method of producing an electronic device according to the present embodiment as described above, it is possible to favorably form an electromagnetic wave-shielding layer on an electronic component and to reduce the number of steps of producing an electronic device.

1. Adhesive Laminated Film

Hereinafter, the adhesive laminated film 50 used in the method of producing an electronic device according to the present embodiment will be described.

<Base Material Layer>

The base material layer 20 is a layer provided for the purpose of further improving the characteristics of the adhesive laminated film 50 such as the handleability, the mechanical characteristics, and heat resistance of the adhesive laminated film 50.

The base material layer 20 is not particularly limited, and examples thereof include a resin film.

As the resin constituting the base material layer 20, a known thermoplastic resin can be used. For example, one or two or more kinds selected from polyolefin such as polyethylene, polypropylene, poly(4-methyl-1-pentene), or poly (1-butene); polyester such as polyethylene terephthalate, polybutylene terephthalate, or polyethylene naphthalate; polyamide such as nylon 6, nylon 66, or polymetaxylene adipamide; polyacrylate; polymethacrylate; polyvinyl chloride; polyimide; polyetherimide; polyamideimide; an ethylene-vinyl acetate copolymer; polyacrylonitrile; polycarbonate; polystyrene; an ionomer; polysulfone; polyethersulfone; polyether ether ketone; polyphenylene sulfide; polyphenylene ether; and an elastomer such as a polyester-based elastomer, a polyamide-based elastomer, a polyimide-based elastomer, or polybutylene terephthalate can be used as the resin.

Among these, from the viewpoint of improving the transparency, one or two or more kinds selected from polypropylene, polyethylene terephthalate, polyethylene naphthalate, polyamide, polyimide, an ethylene-vinyl acetate copolymer, a polyester-based elastomer, a polyamide-based elastomer, a polyimide-based elastomer, and polybutylene terephthalate are preferable; and one or two or more kinds selected from polyethylene terephthalate, polyethylene naphthalate, a polyester-based elastomer, a polyamide-based elastomer, a polyimide-based elastomer, polybutylene terephthalate, and polyimide are more preferable.

Further, from the viewpoint of improving the balance between the heat resistance and the characteristics such as the flexibility or elasticity of the adhesive laminated film 50, one or two or more kinds selected from a polyester-based elastomer, a polyamide-based elastomer, a polyimide-based elastomer, and polybutylene terephthalate are still more preferable as the resin constituting the base material layer 20. In this manner, the elasticity of flexibility of the adhesive laminated film 50 is improved, expansion of the adhesive laminated film 50 in the in-plane direction at the time of peeling the electronic component 10 off from the adhesive laminated film 50 after the step (D) is more easily made, and the electronic component 10 is easily peeled off from the adhesive laminated film 50.

The melting point of the base material layer 20 is preferably 100° C. or higher and more preferably 120° C. or higher. The upper limit of the melting point thereof is not particularly limited and may be selected in consideration of the processability and the like, but may be 300° C. or lower and 250° C. or lower from the viewpoint of improving the expansibility of the adhesive laminated film 50 in the step (F).

By employing such a base material layer 20, it is possible to further suppress deformation and melting of the adhesive laminated film 50 even in a case where the adhesive laminated film 50 is exposed to a high temperature in the step (D).

The base material layer 20 may be formed of a single layer or two or more layers.

As the form of the resin film used for forming the base material layer 20, a stretched film or a film stretched in a uniaxial direction or biaxial direction may be employed.

From the viewpoint of obtaining excellent film characteristics, the thickness of the base material layer 20 is preferably in a range of 10 μm to 500 μm, more preferably in a range of 20 μm to 300 μm, and still more preferably in a range of 25 μm to 250 μm.

A surface treatment may be performed in order to improve the adhesiveness of the base material layer 20 to other layers. Specifically, a corona treatment, a plasma treatment, an undercoat treatment, a primer coat treatment, or the like may be performed.

<Unevenness-Absorptive Resin Layer>

It is preferable that the adhesive laminated film 50 according to the present embodiment further includes an unevenness-absorptive resin layer 30 between the base material layer 20 and the adhesive resin layer 40.

The unevenness-absorptive resin layer 30 is a layer provided for the purpose of improving the followability of the adhesive laminated film 50 to the circuit forming surface 10A and improving the adhesiveness between the circuit forming surface 10A and the adhesive laminated film 50.

Here, according to the examination conducted by the present inventors, it was found that there is a problem in that the circuit is electrically short-circuited because a conductive component for forming the electromagnetic wave-shielding layer enters the circuit forming surface of the electronic component and adheres to the circuit during the formation of the electromagnetic wave-shielding layer on the surface of the electronic component in a state in which the circuit forming surface of the electronic component is protected by a protective film. Further, the circuit constituting the circuit forming surface tends to be electrically short-circuited as the unevenness of the circuit forming surface becomes larger. Particularly, in a case where an electronic component having a circuit forming surface on which a bump electrode is formed is used, the circuit constituting the circuit forming surface tends to be electrically short-circuited.

The present inventors repeatedly conducted intensive examination in order to solve the above-described problem. As the result, it was found that in a case where the adhesiveness between the electronic component and the protective film is insufficient, the conductive component for forming the electromagnetic wave-shielding layer easily enters the circuit forming surface of the electronic component, and this easily causes conduction failure of the circuit.

Particularly, in a case where an electronic component having a circuit forming surface on which a bump electrode or the like which is relatively large unevenness is formed is used, since the followability of the protective film to the unevenness of the circuit forming surface of the electronic component tends to be insufficient, the adhesiveness between the electronic component and the protective film tends to be insufficient. As the result, it was found that since the conductive component for forming the electromagnetic wave-shielding layer easily enters the circuit forming surface of the electronic component, the conduction failure of the circuit constituting the circuit forming surface tends to occur.

The present inventors repeatedly conducted examination based on the above-described findings. As the result, it was found that electrical short circuit of the circuit forming surface 10A can be suppressed an electronic device having an electromagnetic wave-shielding property can be stably obtained by using the adhesive laminated film 50 which includes the base material layer 20, the unevenness-absorptive resin layer 30, and the adhesive resin layer 40 in this order as the film that protects the circuit forming surface 10A of the electronic component 10.

That is, in a case where the adhesive laminated film 50 further includes the unevenness-absorptive resin layer 30, the adhesive laminated film 50 tends to follow the circuit forming surface 10A of the electronic component 10 so that the adhesiveness between the adhesive laminated film 50 and the circuit forming surface 10A of the electronic component 10 can be improved. In this manner, the adhesive laminated film 50 easily follows the unevenness of the circuit forming surface 10A of the electronic component 10 so that the interval between the adhesive laminated film 50 and the circuit forming surface 10A of the electronic component 10 can be further reduced. As the result, it is possible to prevent the conductive component for forming the electromagnetic wave-shielding layer 70 from entering the circuit forming surface 10A of the electronic component 10 and to prevent occurrence of electrical short circuit of the circuit constituting the circuit forming surface 10A, during the formation of the electromagnetic wave-shielding layer 70 on the surface of the electronic component 10.

The resin constituting the unevenness-absorptive resin layer 30 is not particularly limited as long as the resin exhibits unevenness absorbability, and examples thereof include one or two or more selected from the group consisting of a polyolefin-based resin, a polystyrene-based resin, and a (meth)acrylic resin.

Further, it is preferable that the unevenness-absorptive resin layer 30 contains a crosslinkable resin. In a case where the unevenness-absorptive resin layer 30 contains a crosslinkable resin, the heat resistance can be improved by crosslinking the unevenness-absorptive resin layer 30 before the step (D). As the result, deformation and melting of the adhesive laminated film 50 can be further suppressed even in a case where the adhesive laminated film 50 is exposed to a high temperature in the step (D).

The crosslinkable resin according to the present embodiment is not particularly limited as long as the resin can form the unevenness-absorptive resin layer 30 and improves the heat resistance by being crosslinked due to external stimuli such as heat or light. For examples, one or two or more kinds selected from olefin-based resins such as an ethylene/α-olefin copolymer containing ethylene and α-olefin having 3 to 20 carbon atoms, a high-density ethylene-based resin, a low-density ethylene-based resin, a medium-density ethylene-based resin, an ultralow-density ethylene-based resin, a linear low-density polyethylene (LLDPE)-based resin, a propylene (co)polymer, a 1-butene (co)polymer, a 4-methylpentene-1 (co)copolymer, an ethylene/cyclic olefin copolymer, an ethylene/α-olefin/cyclic olefin copolymer, an ethylene/α-olefin/non-conjugated polyene copolymer, an ethylene/α-olefin/conjugated polyene copolymer, an ethylene/aromatic vinyl copolymer, and an ethylene/α-olefin/aromatic vinyl copolymer; ethylene/carboxylic anhydride-based copolymers such as an ethylene/unsaturated carboxylic anhydride copolymer and an ethylene/α-olefin/unsaturated carboxylic anhydride copolymer; ethylene/epoxy-based copolymers such as an ethylene/epoxy-containing unsaturated compound copolymer and an ethylene/α-olefin/epoxy-containing unsaturated compound copolymer; ethylene/(meth)acrylic acid ester copolymers such as an ethylene/ethyl (meth)acrylate copolymer, an ethylene/methyl (meth)acrylate, an ethylene/propyl (meth)acrylate copolymer, an ethylene/(butyl (meth)acrylate copolymer, an ethylene/hexyl (meth)acrylate copolymer, an ethylene/(meth)acrylic acid-2-hydroxyethyl copolymer, an ethylene/(meth)acrylic acid-2-hydroxypropyl copolymer, and an ethylene/glycidyl (meth)acrylate copolymer; ethylene/ethylenically unsaturated acid copolymers such as an ethylene/(meth)acrylic acid copolymer, an ethylene/maleic acid copolymer, an ethylene/fumaric acid copolymer, and an ethylene/crotonic acid copolymer; ethylene/vinyl ester copolymers such as an ethylene/vinyl acetate copolymer, an ethylene/vinyl propionate copolymer, an ethylene/vinyl butyrate copolymer, and an ethylene/vinyl stearate copolymer; ethylene/styrene copolymers; unsaturated carboxylic acid ester (co)polymers such as a (meth) acrylic acid ester (co)polymer; ionomer resins such as an ethylene/acrylic acid metal salt copolymer and an ethylene/methacrylic acid metal salt copolymer; urethane-based resins; silicone-based resins; acrylic acid-based resins; methacrylic acid-based resins; cyclic olefin (co)polymers; α-olefin/aromatic vinyl compound/aromatic polyene copolymers; ethylene/α-olefin/aromatic vinyl compounds; aromatic polyene copolymers; ethylene/aromatic vinyl compound/aromatic polyene copolymer; styrene-based resins; acrylonitrile/butadiene/styrene copolymers; styrene/conjugated diene copolymers; acrylonitrile/styrene copolymers; acrylonitrile/ethylene/α-olefin/non-conjugated polyene/styrene copolymers; acrylonitrile/ethylene/α-olefin/conjugated polyene/styrene copolymers; methacrylic acid/styrene copolymers; ethylene terephthalate resins; fluorine resins; polyester carbonate; polyvinyl chloride; polyvinylidene chloride; polyolefin-based thermoplastic elastomers; polystyrene-based thermoplastic elastomers; polyurethane-based thermoplastic elastomers; 1,2-polybutadiene-based thermoplastic elastomers; transpolyisoprene-based thermoplastic elastomers; chlorinated polyethylene-based thermoplastic elastomers; liquid crystalline polyester; and polylactic acid can be used.

Among these, from the viewpoint of easily carrying out crosslinking with a crosslinking agent such as an organic peroxide, one or two or more kinds selected from olefin-based resins such as an ethylene/α-olefin copolymer containing ethylene and α-olefin having 3 to 20 carbon atoms, a low-density ethylene-based resin, a medium-density ethylene-based resin, an ultralow-density ethylene-based resin, a linear low-density polyethylene (LLDPE)-based resin, an ethylene/cyclic olefin copolymer, an ethylene/α-olefin/cyclic olefin copolymer, an ethylene/α-olefin/non-conjugated polyene copolymer, an ethylene/α-olefin/conjugated polyene copolymer, an ethylene/aromatic vinyl copolymer, and an ethylene/α-olefin/aromatic vinyl copolymer; an ethylene/unsaturated carboxylic anhydride copolymer, an ethylene/α-olefin/unsaturated carboxylic anhydride copolymer, an ethylene/epoxy-containing unsaturated compound copolymer, an ethylene/α-olefin/epoxy-containing unsaturated compound copolymer, an ethylene/vinyl acetate copolymer; ethylene/unsaturated carboxylic acid copolymers such as an ethylene/acrylic acid copolymer, and an ethylene/methacrylic acid copolymer; and 1,2-polybutadiene-based thermoplastic elastomers are preferably used.

One or two or more kinds selected from an ethylene/α-olefin copolymer containing ethylene and α-olefin having 3 to 20 carbon atoms, a low-density ethylene-based resin, an ultralow-density ethylene-based resin, a linear low-density polyethylene (LLDPE)-based resin, an ethylene/α-olefin/non-conjugated polyene copolymer, an ethylene/α-olefin/conjugated polyene copolymer, an ethylene/unsaturated carboxylic anhydride copolymer, an ethylene/α-olefin/unsaturated carboxylic anhydride copolymer, an ethylene/epoxy-containing unsaturated compound copolymer, an ethylene/α-olefin/epoxy-containing unsaturated compound copolymer, an ethylene/vinyl acetate copolymer, and ethylene/unsaturated carboxylic acid copolymers such as an ethylene/acrylic acid copolymer and an ethylene/methacrylic acid copolymer are more preferably used.

One or two or more kinds selected from an ethylene/α-olefin copolymer containing ethylene and α-olefin having 3 to 20 carbon atoms, a low-density ethylene-based resin, an ultralow-density ethylene-based resin, a linear low-density polyethylene (LLDPE)-based resin, an ethylene/α-olefin/non-conjugated polyene copolymer, an ethylene/α-olefin/conjugated polyene copolymer, an ethylene/vinyl acetate copolymer, and ethylene/unsaturated carboxylic acid copolymers such as an ethylene/acrylic acid copolymer and an ethylene/methacrylic acid copolymer are still more preferably used.

Among these, at least one selected from an ethylene/α-olefin copolymer and an ethylene/vinyl acetate copolymer is particularly preferably used. In the present embodiment, the above-described resins may be used alone or in combination thereof.

As α-olefin of the ethylene/α-olefin copolymer containing ethylene and α-olefin having 3 to 20 carbon atoms, which is used as the crosslinkable resin in the present embodiment, typically, α-olefin having 3 to 20 carbon atoms can be used alone or in combination of two or more kinds thereof. Among examples thereof, α-olefin having 10 or less carbon atoms is preferable, and α-olefin having 3 to 8 carbon atoms is particularly preferable. Examples of such α-olefin include propylene, 1-butene, 1-pentene, 1-hexene, 3-methyl-1-butene, 3,3-dimethyl-1-butene, 4-methyl-1-pentene, 1-octene, 1-decene, and 1-dodecene. Among these, from the viewpoint of availability, propylene, 1-butene, 1-pentene, 1-hexene, 4-methyl-1-pentene, and 1-octene are preferable. Further, the ethylene/α-olefin copolymer may be a random copolymer or a block copolymer, but a random copolymer is preferable from the viewpoint of the flexibility.

The thickness of the unevenness-absorptive resin layer 30 is not particularly limited as long as the unevenness-absorptive resin layer is thick enough to embed the unevenness of the circuit forming surface 10A of the electronic component 10, and is preferably in a range of 10 μm to 1000 μm, more preferably in a range of 20 μm to 900 μm, still more preferably in a range of 30 μm to 800 μm, and particularly preferably in a range of 50 μm to 700 μm.

Here, in a case where the circuit forming surface of the electronic component includes a bump electrode, the circuit constituting the circuit forming surface tends to be electrically short-circuited during the formation of the electromagnetic wave-shielding layer on the surface of the electronic component. However, it is possible to suppress occurrence of electric short circuit in the electronic component 10 having the circuit forming surface 10A on which the bump electrode is formed by using the adhesive laminated film 50 further including the unevenness-absorptive resin layer 30.

Further, in a case where the height of the bump electrode which is present on the circuit forming surface 10A of the electronic component 10 is set as H [μm] and the thickness of the unevenness-absorptive resin layer 30 is set as d [μm], H/d is preferably 1 or less, more preferably 0.85 or less, and still more preferably 0.7 or less.

In a case where H/d is less than or equal to the above-described upper limit, the unevenness absorbability can be further improved while the thickness of the adhesive laminated film 50 is further reduced.

The lower limit of H/d is not particularly limited. For example, the lower limit thereof is 0.01 or greater, preferably 0.1 or greater, and more preferably 0.3 or greater. The height of the bump electrode is usually in a range of 2 μm to 600 μm.

Here, according to the examination conducted by the present inventors, it became evident that the circuit constituting the circuit forming surface tends to be electrically short-circuited as the unevenness of the circuit forming surface becomes larger. Therefore, the height of the bump electrode is preferably 10 μm or greater, more preferably 30 μm or greater, still more preferably 50 μm or greater, even still more preferably 80 μm or greater, and particularly preferably 100 μm or greater from the viewpoint of further effectively obtaining the effects of the method of producing an electronic device according to the present embodiment.

<Adhesive Resin Layer>

The adhesive resin layer 40 is a layer provided on one surface side of the base material layer 20 or the unevenness-absorptive resin layer 30 and is brought into contact with the circuit forming surface 10A of the electronic component 10 and adheres thereto at the time of attaching the adhesive laminated film 50 to the circuit forming surface 10A of the electronic component 10.

Examples of the adhesive constituting the adhesive resin layer 40 include a (meth) acrylic-based adhesive, a silicone-based adhesive, a urethane-based adhesive, an olefin-based adhesive, and a styrene-based adhesive. Among these, from the viewpoint of easily adjusting the adhesive strength, a (meth)acrylic adhesive containing a (meth)acrylic polymer as a base polymer is preferable.

As the adhesive constituting the adhesive resin layer 40, a radiation-crosslinking adhesive that decreases the adhesive strength using radiation can be used. The adhesive resin layer 40 formed of a radiation-crosslinking adhesive is crosslinked by being irradiated with radiation, and thus the adhesive strength is significantly decreased. Accordingly, the electronic component 10 is likely to be peeled off from the adhesive resin layer 40 in the step (F) of peeling the electronic component 10 off from the adhesive laminated film 50 described below. Examples of the radiation include ultraviolet rays, electron beams, and infrared rays.

As the radiation-crosslinking adhesive, an ultraviolet-crosslinking adhesive is preferable.

Examples of the (meth)acrylic polymer contained in the (meth)acrylic-based adhesive include a homopolymer of a (meth) acrylic acid ester compound; and a copolymer of a (meth) acrylic acid ester compound and a comonomer. Examples of the (meth)acrylic acid ester compound include methyl (meth)acrylate, ethyl (meth)acrylate, butyl (meth) acrylate, 2-ethylhexyl (meth)acrylate, hydroxyethyl (meth) acrylate, hydroxypropyl (meth) acrylate, dimethylaminoethyl (meth)acrylate, and glycidyl (meth)acrylate. These (meth)acrylic acid ester compounds may be used alone or in combination of two or more kinds thereof.

Further, examples of the comonomer constituting the (meth) acrylic copolymer include vinyl acetate, (meth) acrylonitrile, styrene, (meth)acrylic acid, itaconic acid, (meth) acrylamide, methylol (meth)acrylamide, and maleic anhydride. These comonomers may be used alone or in combination of two or more kinds thereof.

The radiation-crosslinking adhesive contains the (meth) acrylic polymer, a crosslinkable compound (a component having a carbon-carbon double bond), and a photopolymerization initiator or thermal polymerization initiator.

Examples of the crosslinkable compound include a monomer, an oligomer, and a polymer which have a carbon-carbon double bond in a molecule and can be crosslinked by radical polymerization. Examples of such a crosslinkable compound include an ester of polyhydric alcohol and (meth) acrylic acid such as trimethylolpropane tri(meth)acrylate, pentaerythritol tri(meth)acrylate, tetraethylene glycol di(meth)acrylate, 1,6-hexanediol di(meth)acrylate, neopentyl glycol di(meth)acrylate, or dipentaerythritol hexa(meth)acrylate; an ester (meth)acrylate oligomer; and isocyanurate such as 2-propenyl di-3-butenyl cyanurate, 2-hydroxyethyl bis(2-(meth)acryloxyethyl) isocyanurate, or tris(2-methacryloxyethyl) isocyanurate, and an isocyanurate compound.

Further, the crosslinkable compound may not be added in a case where the (meth)acrylic polymer is a radiation-crosslinking polymer having a carbon-carbon double bond in a side chain of the polymer.

The content of the crosslinkable compound is preferably in a range of 5 to 900 parts by mass, more preferably in a range of 5 to 100 parts by mass, and still more preferably in a range of 10 to 50 parts by mass with respect to 100 parts by mass of the (meth) acrylic polymer. In a case where the content of the crosslinkable compound is in the above-described range, the adhesive strength is likely to be adjusted compared to a case where the content thereof is less than the above-described range, and degradation of the storage stability due to extremely high sensitivity to heat or light is unlikely to occur compared to a case where the content thereof is greater than the above-described range.

The photopolymerization initiator may be a compound that cleaves and generates a radical by being irradiated with radiation, and examples thereof include benzoin alkyl ethers such as benzoin methyl ether, benzoin isopropyl ether, and benzoin isobutyl ether; aromatic ketones such as benzyl, benzoin, benzophenone, and α-hydroxycyclohexyl phenyl ketone; aromatic ketals such as benzyl dimethyl ketal; polyvinyl benzophenone; and thioxanthones such as chlorothioxanthone, dodecyl thioxanthone, dimethyl thioxanthone, and diethyl thioxanthone.

Examples of the thermal polymerization initiator include an organic peroxide derivative and an azo-based polymerization initiator. From the viewpoint that nitrogen is not generated at the time of being heated, an organic peroxide derivative is preferable. Examples of the thermal polymerization initiator include ketone peroxide, peroxy ketal, hydroperoxide, dialkyl peroxide, diacyl peroxide, peroxy ester, and peroxy dicarbonate.

A crosslinking agent may be added to the adhesive. Examples of the crosslinking agent include epoxy-based compounds such as sorbitol polyglycidyl ether, polyglycerol polyglycidyl ether, pentaerythritol polyglycidyl ether, and diglycerol polyglycidyl ether; aziridine compounds such as tetramethylolmethane-tri-β-aziridinylpropionate, trimethylolpropane-tri-β-aziridinylpropionate, N,N'-diphenylmethane-4,4'-bis(1-aziridinecarboxamide), and N,N'-hexamethylene-1,6-bis(1-aziridinecarboxamide); and isocyanate-based compounds such as tetramethylene diisocyanate, hexamethylene diisocyanate, and polyisocyanate.

From the viewpoint of improving the balance between the adhesive strength and the heat resistance of the adhesive resin layer 40, the content of the crosslinking agent is preferably in a range of 0.1 parts by mass to 10 parts by mass with respect to 100 parts by mass of the (meth)acrylic polymer.

The thickness of the adhesive resin layer 40 is not particularly limited, but is preferably in a range of 1 μm to 100 μm and more preferably in a range of 3 μm to 50 μm.

The adhesive resin layer 40 can be formed by coating the base material layer 20 or the unevenness-absorptive resin layer 30 with an adhesive coating solution.

As the method of coating the layer with the adhesive coating solution, a known coating method of the related art such as a roll coater method, a reverse roll coater method, a gravure roll method, a bar coating method, a comma coater method, and a die coater method. The conditions for drying the applied adhesive are not particularly limited, but it is preferable that the adhesive is typically dried in a temperature range of 80° C. to 200° C. for 10 seconds to 10 minutes. It is more preferable that the adhesive is dried in a temperature range of 80° C. to 170° C. for 15 seconds to 5 minutes. In order to sufficiently promote the crosslinking reaction between the crosslinking agent and the adhesive, the layer may be heated in a temperature range of 40° C. to 80° C. for 5 to 300 hours after the adhesive coating solution is dried.

The total light transmittance of the adhesive laminated film 50 according to the present embodiment is preferably 85% or greater and more preferably 90% or greater. In this manner, the transparency can be imparted to the adhesive laminated film 50. By setting the total light transmittance of the adhesive laminated film 50 to be greater than or equal to the above-described lower limit, the adhesive resin layer 40 can be more effectively irradiated with radiation during irradiation with radiation from the base material layer 20 side in the adhesive laminated film 50 according to the present embodiment, and the radiation irradiation efficiency can be improved. Further, the total light transmittance of the adhesive laminated film 50 can be measured in conformity with JIS K 7105 (1981).

From the viewpoint of the balance between the mechanical characteristics and the handleability, the total thickness of the adhesive laminated film 50 according to the present embodiment is preferably in a range of 25 μm to 1100 μm, more preferably in a range of 100 μm to 900 μm, and still more preferably in a range of 200 μm to 800 μm.

The adhesive laminated film 50 according to the present embodiment may be provided with an adhesive layer (not illustrated) between layers. According to this adhesive layer, the adhesiveness between layers can be improved.

Next, an example of the method of producing the adhesive laminated film 50 according to the present embodiment will be described.

First, the unevenness-absorptive resin layer 30 is formed on one surface of the base material layer 20 according to an extrusion laminating method. Next, the adhesive resin layer 40 is formed by coating the unevenness-absorptive resin layer 30 with the adhesive coating solution and drying the solution to obtain the adhesive laminated film 50.

Further, the base material layer 20 and the unevenness-absorptive resin layer 30 may be formed by coextrusion molding or by laminating the film-like base material layer 20 on the film-like unevenness-absorptive resin layer 30.

2. Method of Producing Electronic Device

Next, each step in the method of producing an electronic device according to the present embodiment will be described.

(Step (A))

First, the structure 60 which includes the electronic component 10 having the circuit forming surface 10A, and the adhesive laminated film 50 in which the adhesive resin layer 40 is attached to the circuit forming surface 10A of the electronic component 10 such that the circuit forming surface 10A is protected is prepared.

Such a structure 60 can be prepared by attaching the electronic component 10 having the circuit forming surface 10A onto the adhesive resin layer 40 of the adhesive laminated film 50. The number of electronic components 10 to be attached onto the adhesive resin layer 40 of the adhesive laminated film 50 may be one or two or more.

Hereinafter, the method of producing the structure 60 will be described.

First, the electronic component 10 is attached onto the adhesive resin layer 40 of the adhesive laminated film 50.

The electronic component 10 to be attached to the adhesive laminated film 50 is not particularly limited as long as the electronic component has a circuit forming surface and requires the electromagnetic wave-shielding property, and examples thereof include a semiconductor wafer, a mold wafer, a mold panel, a mold array package, and a semiconductor substrate.

Further, examples of the semiconductor substrate include a silicon substrate, a sapphire substrate, a germanium substrate, a germanium-arsenic substrate, a gallium-phosphorus substrate, a gallium-arsenic-aluminum substrate, a gallium-arsenic substrate, and a lithium tantalate substrate.

Further, the electronic component 10 may be an electronic component used for any application, and examples thereof include an electronic component for a logic (such as an electronic component for communication or an electronic component for high frequency signal processing), an electronic component for a memory, an electronic component for a sensor, and an electronic component for a power source. These may be used alone or in combination of two or more kinds thereof.

Since the circuit forming surface 10A of the electronic component 10 has the electrode 10B, the circuit forming surface 10A is formed as an uneven surface.

Further, the electrode 10B is bonded to an electrode formed on a mounting surface at the time of mounting the electronic device on the mounting surface so that electrical connection is formed between the electronic device and the mounting surface (the mounting surface of a printed circuit board or the like).

Examples of the electrode 10B include bump electrodes such as a ball bump, a printed bump, a stud bump, a plated bump, and a pillar bump. That is, the electrode 10B is typically a protruding electrode. These bump electrodes may be used alone or in combination of two or more kinds thereof.

Further, the kind of metal constituting the bump electrode is not particularly limited, and examples thereof include silver, gold, copper, tin, lead, bismuth, and alloys thereof. These metals may be used alone or in combination of two or more kinds thereof.

(Step (B))

Next, the surface (hereinafter, also referred to as the rear surface) of the electronic component 10 opposite to the circuit forming surface 10A is back-ground in a state in which the electronic component is attached to the adhesive laminated film 50.

Here, the back grinding indicates that the electronic component 10 is thinned to have a predetermined thickness without breaking or damaging the electronic component 10.

The electronic component 10 can be back-ground according to a known method. For example, a method of fixing the structure 60 to a chuck table or the like of a grinding machine and grinding the rear surface (circuit non-forming surface) surface on of the electronic component 10 is exemplified.

The rear surface grinding system is not particularly limited, and a known grinding system such as a through-feed system or an in-feed system can be employed. The grinding can be performed while the electronic component 10 and a grindstone are cooled by adding water thereto.

(Step (C))

Next, the back-ground electronic component 10 is diced in a state of being attached to the adhesive laminated film 50. The electronic component 10 can be diced according to a known method.

Here, the "dicing" includes an operation (a) of cutting the electronic component 10 so that the electronic component 10 is provided with a notch having a depth which is the same as the thickness of the electronic component 10 to obtain a plurality of divided electronic components 10 (hereinafter, also referred to as "full-cut dicing") and an operation (b) of irradiating the electronic component 10 with laser light so that the electronic component 10 is provided with an altered region that does not actually cut the electronic component 10 to obtain a plurality of electronic components 10 (hereinafter, also referred to as "stealth dicing").

The dicing can be performed under known conditions using a dicing blade (dicing saw), laser light, and the like.

In a case where the dicing is full-cut dicing, the electronic component 10 is divided into a plurality of electronic components 10 through the dicing.

Meanwhile, in a case where the dicing is stealth dicing, the electronic component 10 is not divided into a plurality of electronic components 10 only through the dicing. The electronic component 10 is divided by expansion of the adhesive laminated film 50 after the dicing to obtain a plurality of divided electronic components 10.

(Step (D))

Next, the electromagnetic wave-shielding layer 70 is formed on the separated electronic components 10 in a state in which the electronic components 10 are attached to the adhesive laminated film 50.

In the step (D), for example, the electromagnetic wave-shielding layer 70 is formed on a surface opposite to the circuit forming surface 10A and a side surface that connects the circuit forming surface 10A with the opposite surface of the electronic component 10 as illustrated in (D) of FIG. 2.

The method of forming the electromagnetic wave-shielding layer 70 on the electronic component 10 is not particularly limited, and a known method can be used. Examples thereof include a sputtering method, a vapor deposition method, a spray coating method, an electrolytic plating method, and an electroless plating method.

Examples of the sputtering method include a DC sputtering method, an RF sputtering method, a magnetron sputtering method, an ion beam sputtering method, and a reactive sputtering method. These may be used alone or in combination of two or more kinds thereof.

Examples of the vapor deposition method include a vacuum vapor deposition method and a chemical vapor deposition method (CVD method). These may be used alone or in combination of two or more kinds thereof.

Examples of the vacuum vapor deposition method include a molecular beam epitaxy method (MBE method) and a physical vapor deposition method (PVD method). These may be used alone or in combination of two or more kinds thereof.

Examples of the CVD method include a thermal CVD method, a catalytic CVD method, a photo-CVD method, a plasma CVD method, a laser CVD method, an epitaxial CVD method, an atomic layer CVD method, an organic metal CVD method, and a chloride CVD method. These may be used alone or in combination of two or more kinds thereof.

Among these various dry deposition methods, from the viewpoint of suppressing the load temperature to be relatively low, a magnetron sputtering method or a plasma CVD method is preferable.

It is preferable that the material constituting the electromagnetic wave-shielding layer 70 is conductive. Specifically, it is preferable that the material has a conductivity in which the electrical resistivity at 20° C. is 10000 μΩ·cm or less. The electrical resistivity is more preferably 200 μΩ·cm or less and particularly preferably 100 μΩ·cm or less.

The conductive component constituting the electromagnetic wave-shielding layer 70 is not particularly limited, and a metal is preferable. Examples thereof include metals such as Mg, Al, Ti, V, Cr, Mn, Fe, Co, Ni, Cu, Zn, Nb, Mo, Ru, Rh, Pd, Ag, In, Sn, Sb, W, Re, Ir, Pt, Au, and Bi; alloys containing two or more metals selected from these metals; and oxides (such as ITO ($In_2O_3$—$SnO_2$), ATO ($SnO_2$—Sb), and FTO ($SnO_2$—F)). These may be used alone or in combination of two or more kinds thereof.

Among these, a metal film containing one or two or more of Au, Pt, Ag, Cu, Ni, Al, and Fe, an ITO film, or an ATO film is preferable.

The film thickness of the electromagnetic wave-shielding layer 70 is not particularly limited as long as the shielding characteristics can be exhibited, but is preferably 100 µm or less and more preferably 50 µm or less. Meanwhile, the thinnest film thickness is not particularly limited, but is preferably 0.5 µm or greater.

(Step (E))

During the formation of the electromagnetic wave-shielding layer 70 in the step (D) described above, the unevenness-absorptive resin layer 30 is heated at a high temperature according to a sputtering method or a vapor deposition method in some cases. Further, even in the electrolytic plating method or electroless plating method, the unevenness-absorptive resin layer 30 is also exposed to a high temperature by carrying out the post step of annealing the electromagnetic wave-shielding layer 70. Therefore, it is preferable that the method of producing an electronic device according to the present embodiment further include a step (E) of crosslinking the unevenness-absorptive resin layer 30 to improve the heat resistance of the unevenness-absorptive resin layer 30 between the step (A) and the step (D). In this manner, deformation and melting of the adhesive laminated film 50 can be further suppressed even in a case where the adhesive laminated film 50 is exposed to a high temperature in the step (D). The timing for performing the step (E) is not particularly limited as long as the step (E) is performed between the step (A) and the step (D), and the step (E) may be performed at any timing.

The method of crosslinking the unevenness-absorptive resin layer 30 is not particularly limited as long as a crosslinkable resin can be crosslinked, and examples thereof include a method of carrying out crosslinking using a radical polymerization initiator; a method of carrying out crosslinking using sulfur or a sulfur-based compound; and a method of carrying out crosslinking using ultraviolet rays, electron beams, or radiation such as γ-rays. In the crosslinking using a radical polymerization initiator, a radical polymerization initiator used for crosslinking a crosslinkable resin can be used. Examples of the radical polymerization initiator include known thermal radical polymerization initiators, photoradical polymerization initiators, and combinations thereof.

In a case where the unevenness-absorptive resin layer 30 is crosslinked using sulfur or a sulfur-based compound, the unevenness-absorptive resin layer 30 may be crosslinked by blending a vulcanization accelerator or a vulcanization accelerator aid with the unevenness-absorptive resin layer 30.

Further, the unevenness-absorptive resin layer 30 may be crosslinked by blending a crosslinking aid with the unevenness-absorptive resin layer 30 even in any crosslinking method.

(Step (F))

Further, in the method of producing an electronic device according to the present embodiment, a step (F) of peeling the electronic component 10 from the adhesive laminated film 50 may be performed after the step (D). The electronic component 10 can be peeled off from the adhesive laminated film 50 by performing the step (F).

The electronic component 10 can be peeled off from the adhesive laminated film 50 according to a known method.

It is preferable that the electronic component 10 is peeled off from the adhesive laminated film 50 in the step (F) in a state in which an interval between adjacent electronic components 10 is enlarged by expanding a region of the adhesive laminated film 50 where the electronic component 10 is attached, in an in-plane direction of the film.

In this manner, since the interval between adjacent electronic components 10 is enlarged, the electronic components 10 are likely to be peeled off from the adhesive laminated film 50. Further, since the adhesive strength between the electronic component 10 and the adhesive resin layer 40 is decreased due to the shearing stress between the electronic component 10 and the adhesive resin layer 40, which is generated due to expansion of the adhesive resin layer 40 in the in-plane direction, the electronic component 10 is likely to be peeled off from the adhesive laminated film 50.

(Step (G))

In the method of producing an electronic device according to the present embodiment, a step (G) of irradiating the adhesive resin layer 40 with radiation to crosslink the adhesive resin layer 40 may be performed before the step (F) so that the adhesive strength of the adhesive resin layer 40 with respect to the electronic component 10 is decreased. The timing for performing the step (G) is not particularly limited as long as the step (G) is performed between the step (A) and the step (F), and the step (G) may be performed at any timing.

The electronic component 10 is likely to be peeled off from the adhesive resin layer 40 by performing the step (G). Further, it is possible to suppress contamination of the surface of the electronic component 10 due to the adhesive component constituting the adhesive resin layer 40.

For example, the radiation is applied from the surface of the adhesive laminated film 50 opposite to the surface of the adhesive resin layer 40 side.

(Other Steps)

The method of producing an electronic device according to the present embodiment may include steps other than the above-described steps. As other steps, known steps in methods of producing an electronic device can be used.

For example, a rear surface protective layer may be formed after the back grinding step (B) by attaching the protective film to the grinding surface (circuit non-forming surface) and curing the film.

Further, arbitrary steps, which have been typically performed in steps of producing electronic components, such as a step of mounting the obtained electronic component 10 on a mounted substrate (printed circuit board), a wire bonding step, and a sealing step may be further performed after the step (F).

Hereinbefore, the embodiments of the present invention have been described, but these are merely examples of the present invention and various other configurations can be employed.

Further, the present invention is not limited to the above-described embodiments, and modifications, improvements, and the like can be included in the present invention within a range where the purpose of the present invention can be achieved.

This application claims priority based on Japanese Patent Application No. 2017-141005 filed on Jul. 20, 2017, the entire disclosure of which is incorporated herein by reference.

The invention claimed is:

1. A method of producing an electronic device, comprising:
   a step (A) of preparing a structure which includes an electronic component having a circuit forming surface, and an adhesive laminated film which includes a base material layer and an adhesive resin layer and in which the adhesive resin layer is attached to the circuit forming surface of the electronic component such that the circuit forming surface is protected;

a step (B) of back-grinding a surface of the electronic component opposite to the circuit forming surface in a state of being attached to the adhesive laminated film;

a step (C) of dicing the electronic component in the state of being attached to the adhesive laminated film; and a step (D) of forming an electromagnetic wave-shielding layer on the separated electronic components in the state of being attached to the adhesive laminated film, in this order, wherein the identical adhesive laminated film is used as the adhesive laminated film in the step (A), the step (B), the step (C), and the step (D), wherein the step (C) is either (a) cutting the electronic component so that the electronic component is provided with a notch having a depth which is the same as a thickness of the electronic component to obtain a plurality of divided electronic components, or (b) irradiating the electronic component with laser light so that the electronic component is provided with an altered region that does not actually cut the electronic component to obtain a plurality of electronic components, wherein the adhesive laminated film further includes an unevenness-absorptive resin layer between the base material layer and the adhesive resin layer, wherein the method further comprising a step (E) of crosslinking the unevenness-absorptive resin layer to improve heat resistance of the unevenness-absorptive resin layer between the step (A) and the step (D), and wherein a resin constituting the base material layer contains one or two or more selected from the group consisting of a polyester-based elastomer, a polyamide-based elastomer, a polyimide-based elastomer, and polybutylene terephthalate.

2. The method of producing an electronic device according to claim 1,
wherein the unevenness-absorptive resin layer contains a crosslinkable resin.

3. The method of producing an electronic device according to claim 1,
wherein a thickness of the unevenness-absorptive resin layer is in a range of 10 μm to 1000 μm.

4. The method of producing an electronic device according to claim 1, further comprising:
a step (F) of peeling the electronic component and the adhesive laminated film from each other after the step (D).

5. The method of producing an electronic device according to claim 4,
wherein the electronic component is peeled off from the adhesive laminated film in the step (F) in a state in which an interval between adjacent electronic components is enlarged by expanding a region of the adhesive laminated film where the electronic component is attached, in an in-plane direction of the adhesive laminated film.

6. The method of producing an electronic device according to claim 4,
wherein the adhesive resin layer contains a radiation-crosslinking adhesive, and
the method further comprises a step (G) of irradiating the adhesive resin layer with radiation to crosslink the adhesive resin layer before the step (F).

7. The method of producing an electronic device according to claim 1,
wherein the circuit forming surface of the electronic component includes a bump electrode.

8. The method of producing an electronic device according to claim 7,
wherein in a case where a height of the bump electrode is set as H [μm] and a thickness of the unevenness-absorptive resin layer is set as d [μm], H/d is in a range of 0.01 to 1.

9. The method of producing an electronic device according to claim 1,
wherein the electromagnetic wave-shielding layer is formed on at least a surface opposite to the circuit forming surface and a side surface that connects the circuit forming surface with the opposite surface of the electronic component in the step (D).

10. The method of producing an electronic device according to claim 1,
wherein an adhesive constituting the adhesive resin layer contains one or two or more selected from a (meth) acrylic-based adhesive, a silicone-based adhesive, a urethane-based adhesive, an olefin-based adhesive, and a styrene-based adhesive.

11. The method of producing an electronic device according to claim 1,
wherein the electromagnetic wave-shielding layer is formed on the electronic component in the step (D) using at least one method selected from a sputtering method, a vapor deposition method, a spray coating method, an electrolytic plating method, and an electroless plating method.

* * * * *